United States Patent
Chen et al.

(10) Patent No.: US 9,941,891 B2
(45) Date of Patent: Apr. 10, 2018

(54) ADAPTIVE SPUR CANCELLATION TECHNIQUES AND MULTI-PHASE INJECTION LOCKED TDC FOR DIGITAL PHASE LOCKED LOOP CIRCUIT

(71) Applicant: University of Southern California, Los Angeles, CA (US)

(72) Inventors: Shuo-Wei Chen, Los Angeles, CA (US); Cheng-Ru Ho, Los Angeles, CA (US)

(73) Assignee: University of Southern California, Los Angeles, CA (US)

( * ) Notice: Subject to any disclaimer, the term of this patent is extended or adjusted under 35 U.S.C. 154(b) by 0 days.

(21) Appl. No.: 15/170,882

(22) Filed: Jun. 1, 2016

(65) Prior Publication Data
US 2016/0359493 A1 Dec. 8, 2016

Related U.S. Application Data

(60) Provisional application No. 62/169,264, filed on Jun. 1, 2015.

(51) Int. Cl.
*H03L 7/06* (2006.01)
*H03L 7/093* (2006.01)
*H03L 7/099* (2006.01)

(52) U.S. Cl.
CPC ............ *H03L 7/093* (2013.01); *H03L 7/099* (2013.01); *H03L 7/0995* (2013.01); *H03L 2207/06* (2013.01); *H03L 2207/50* (2013.01)

(58) Field of Classification Search
CPC ....... H03L 7/08; H03L 7/0802; H03L 7/0805; H03L 7/0807; H03L 7/083; H03L 7/085;
(Continued)

(56) References Cited

U.S. PATENT DOCUMENTS 7,145,399 B2 12/2006 Staszewski et al.
7,786,913 B2 8/2010 Waheed et al.
(Continued)

OTHER PUBLICATIONS

Mike Shuo-Wei Chen et al.; A Calibration-Free 800MHz Fractional-N Digital PLL with Embedded TDC; Atheros Communications, Santa Clara, CA; pp. 473-475; 2010 IEEE International Solid-State Circuits Conference.
(Continued)

*Primary Examiner* — Lincoln Donovan
*Assistant Examiner* — Diana J Cheng
(74) *Attorney, Agent, or Firm* — Brooks Kushman P.C.

(57) ABSTRACT

A digital phase-locked loop includes a digital loop filter, a digitally controllable oscillator (DCO), and an injection-locked calibration-free time-to-digital converter (TDC) having a ring oscillator connected to the DCO via an input buffer that converts a sinusoidal DCO signal to a differential square wave signal provided to the ring oscillator such that ring oscillator frequency matches DCO frequency. A spur cancellation loop between the TDC and digital loop filter generates a spur cancellation signal based on an estimate of a spurious tone amplitude and phase. The spur cancellation signal is subtracted from TDC output signals prior to input to the digital loop filter. The spur cancellation loop may include a gradient descent strategy, or a feedforward strategy having a high-pass filter, integer delay chain, adaptive fractional delay, and signal averaging logic to cancel multiple internal and external spurs having frequencies that are not related to the reference clock frequency.

19 Claims, 16 Drawing Sheets

(58) Field of Classification Search
CPC ......... H03L 7/093; H03L 7/095; H03L 7/097; H03L 7/099; H03L 7/10; H03L 7/14; H03L 7/16; H03L 7/18; H03L 7/20; H03L 2207/50; H03L 7/0991
USPC .................................................. 327/156–159
See application file for complete search history.

(56) References Cited

U.S. PATENT DOCUMENTS

| | | | |
|---|---|---|---|
| 8,531,322 B2 * | 9/2013 | Cao ..................... | G04F 10/005 324/160 |
| 9,182,295 B1 * | 11/2015 | Perrott .................. | G01K 7/226 |
| 2015/0145566 A1 * | 5/2015 | Perrott .................. | H03L 7/0991 327/154 |

OTHER PUBLICATIONS

Frank Opteynde; A 40nm CMOS All-Digital Fractional-N Synthesizer without Requiring Calibration; Audax-Technologies, Leuven Belgium; pp. 346-347; 2012 IEEE International Solid-State Circuits Conference.

* cited by examiner

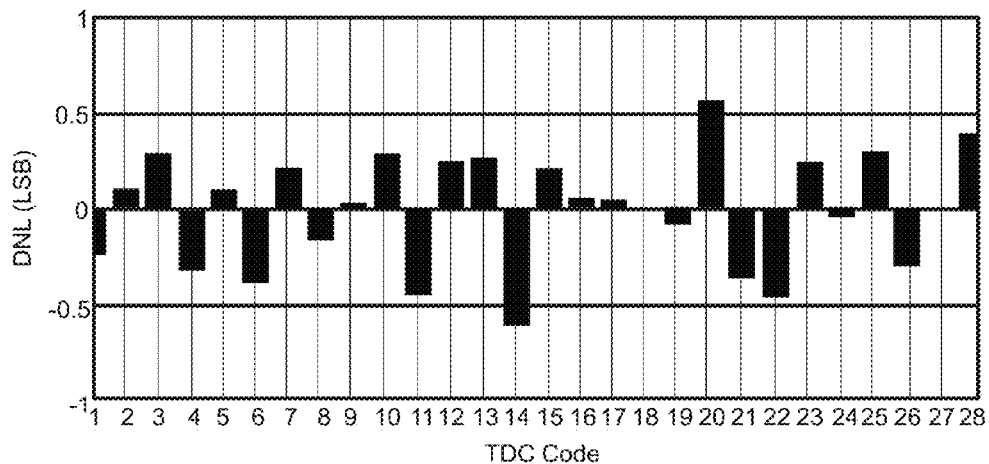
Fig. 5
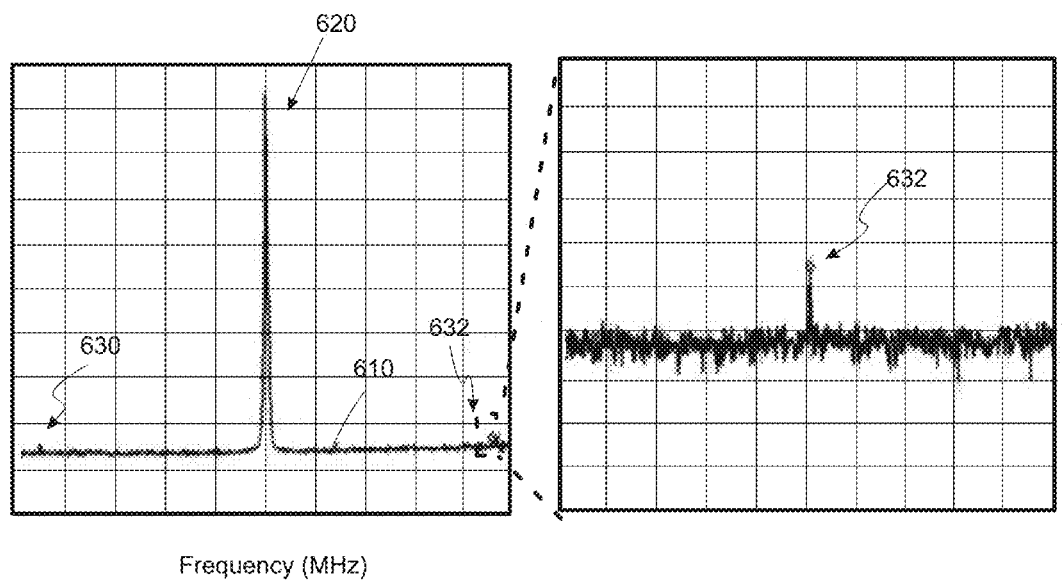
Fig. 6A
Fig. 6B

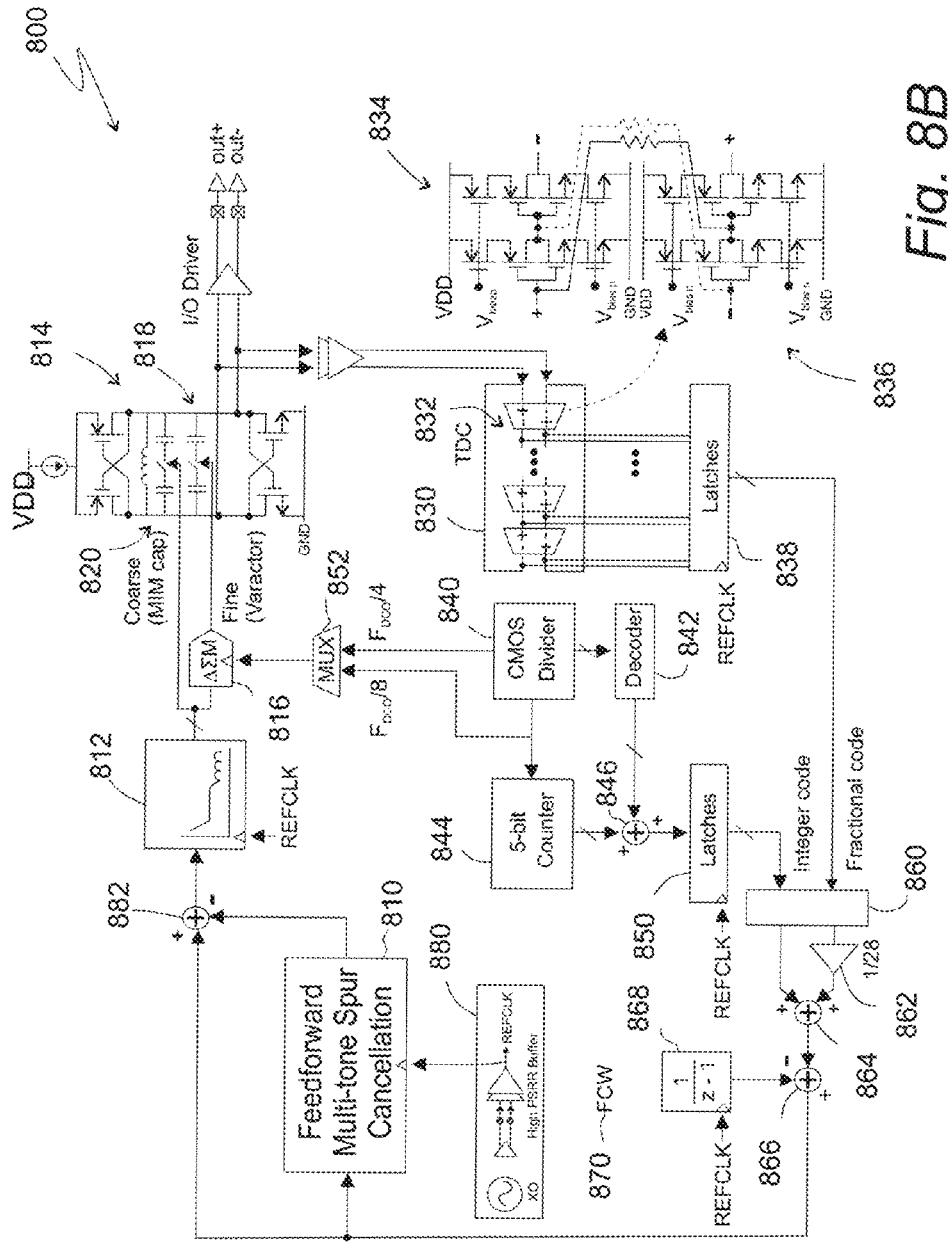

ADAPTIVE SPUR CANCELLATION TECHNIQUES AND MULTI-PHASE INJECTION LOCKED TDC FOR DIGITAL PHASE LOCKED LOOP CIRCUIT

CROSS-REFERENCE TO RELATED APPLICATIONS

This application claims the benefit of U.S. provisional application Ser. No. 62/169,264 filed Jun. 1, 2015, the disclosure of which is hereby incorporated in its entirety by reference herein.

STATEMENT REGARDING FEDERALLY SPONSORED RESEARCH OR DEVELOPMENT

This invention was made with Government support under Contract No. HR0011-12-C-0094, awarded by the Defense Advanced Research Projects Agency (DARPA). The Government has certain rights to the invention.

TECHNICAL FIELD

This disclosure relates to electronic circuits that implement a digital phased locked loop.

BACKGROUND

The trend of the system on a chip (SoC) and multi-radio integration urges the need for low cost, low spurious tone, and highly reconfigurable frequency synthesizers. There has been increasing interest in exploring the mostly digital architecture for a phase locked loop (PLL) that replaces the bulky analog circuit components. This type of PLL architecture offers a significant potential for exploring digital signal processing (DSP) algorithms that are not possible in the conventional analog PLL architecture; however, it does incur the overhead of time-to-digital conversion and may introduce quantization noise.

Due to the fully integrated design of SoC implementations, the frequency synthesizer is often physically close to other noise interferers, such as digital circuits, clock buffers and high power analog circuits. These noisy interferences can be coupled into the PLL through various paths, such as the substrate, bonding wires, and power supplies. The noisy interferences often appear as spurious tones (spurs) in the PLL output spectrum. Moreover, the spurious tones can be generated internally by the PLL operation, such as those associated with operation of a fractional-N divider. As a result, the ability to reject spurs associated with internal and external sources becomes an important consideration in the PLL design. Conventionally, spur rejections are implemented via analog approaches, such as separating power supplies, increasing power-supply-rejection-ratio (PSRR), and careful layout. However, performance is still limited by the matching and parasitic coupling paths.

SUMMARY

In various embodiments, a digital phase-locked loop architecture or system includes a digital loop filter, a digitally controllable oscillator (DCO) connected to an output of the digital loop filter, and a time-to-digital converter (TDC) having an input buffer connected to the DCO, and a ring oscillator connected to the input buffer, the input buffer converting a sinusoidal signal from the DCO to a differential square wave signal provided to the ring oscillator such that a ring oscillator frequency matches a DCO frequency. The digital phase-locked loop may also include a spur cancellation loop disposed between a TDC output and an input of the digital loop filter, the spur cancellation loop configured to generate a spur cancellation signal based on an estimate of a spurious tone amplitude and phase, the spur cancellation signal subtracted from TDC output signals prior to the TDC output signals being input to the digital loop filter. The estimate may be based on a gradient descent algorithm or least mean squares (LMS) algorithm.

One or more embodiments may include a the spur cancellation loop having a plurality of digital synthesizers each generating a skewed replica signal of the spurious tone with one of an amplitude offset and a phase offset, a plurality of correlators each generating a correlation signal based on a correlation between sine and cosine signals having an estimated spurious tone frequency and a difference between a respective skewed replica signal and an output of the TDC, and a minimum energy selector configured to select a minimum residue energy signal from the plurality of correlation signals. In various embodiments, the spur cancellation loop may include a feedforward path having a high-pass filter, an integer delay chain including a plurality of delay elements connected in series with an input connected to an output of the high-pass filter and configured to provide an integer delay, an adaptive fractional delay filter connected to an output of the integer delay chain and configured to provide a fractional delay, the sum of the integer delay and the fractional delay corresponding to a spur period, and signal averaging logic configured to receive an output of the adaptive fractional delay filter and compute an averaged spur cancellation signal based on the spur period. The signal averaging logic may include fractional averaging logic configured to compute an averaged spur cancellation signal based on downsampling of the output of the adaptive fractional delay filter by a first integer for a first number of spur periods and by a second integer for a second number of spur periods to provide fractional downsampling.

In one or more embodiments, a method for reducing a spurious tone during operation of a phase-locked loop may include generating a spur cancellation signal based on an estimated spur frequency in an output signal from a time-to-digital converter (TDC) and subtracting the spur cancellation signal from the output signal prior to the output signal being supplied to a digital loop filter. In one embodiment, generating the spur cancellation signal includes filtering the TDC output signal with a high pass filter having a zero at DC to generate a filtered signal, applying an integer delay to the filtered signal and a fractional delay to the integer delayed signal, and averaging the delayed signal based on an estimated period of the spurious tone. The method may also include estimating the spur frequency based on a gradient descent algorithm. In various embodiments, the method includes coupling a multi-stage ring oscillator of the TDC to a digitally controlled oscillator to match frequency of the ring oscillator to frequency of the digitally controlled oscillator.

Embodiments of the present disclosure may provide one or more advantages. For example, various embodiments provide a robust and low-cost fractional-N digital phase locked loop (DPLL) architecture that includes adaptive spurious tone (spur) cancellation and/or a calibration-free time-to-digital converter (TDC). In one or more embodiments, the DPLL architecture includes a TDC that leverages an injection locked ring oscillator to achieve a fine resolution of about 7 ps that automatically tracks the period of the digital controlled oscillator (DCO). As such, TDC gain calibration is not required to adjust for variation of manufacturing process, voltage, or temperature (PVT). The gradient-based adaptive spur cancellation strategy according to various embodiments suppresses spurious tones associated with external as well as internal interferences and may provide more than 40 dB improvement in lab-based measurements. The DPLL may be implemented in 65 nm CMOS to synthesize frequencies between about 2.7 GHz-4.8 GHz with fine frequency resolution of about 610 Hz. In at least one embodiment, measured phase noise is about −130 dBc/Hz at 3 Mhz offset and the reference spur achieves −86.45 dBc.

Embodiments may also include a generalized spur cancellation strategy implemented within a PLL loop that may improve performance up to ten times or more relative to the prior state of the art. The generalized feedforward cancellation strategy can be easily extended to multiple internal and external spur coupling sources and to various application scenarios. The generalized spur cancellation strategy does not significantly raise the noise floor, which is a recognized disadvantage of dithering approaches used to mitigate spur level.

The above advantages and other advantages and features associated with various embodiments will be readily apparent to those of ordinary skill in the art from the following detailed description when taken in connection with the accompanying drawings.

BRIEF DESCRIPTION OF THE DRAWINGS

FIG. 5 illustrates differential nonlinearity (DNL) associated with a representative embodiment of an injection-locked (IL) TDC according to the disclosure;

FIGS. 6A and 6B illustrate a measured reference spur used in evaluating performance of a representative embodiment of a DPLL architecture according to the disclosure;

FIGS. 8A and 8B illustrate a representative DPLL architecture having an IL-TDC and feedforward multi-tone spur cancellation according to embodiments of the disclosure;

DETAILED DESCRIPTION

Representative embodiments are described in detail herein; however, it is to be understood that the disclosed embodiments are merely illustrative and may be embodied in various and alternative forms. The figures are not necessarily to scale; some features may be simplified, exaggerated, or minimized to better illustrate particular components or features. Therefore, specific structural and functional details disclosed herein are not to be interpreted as limiting, but merely as a representative basis for teaching one skilled in the art to variously employ the claimed subject matter.

The processes, methods, algorithms, logic, or functional blocks disclosed can be implemented using various digital and analog devices that may include a processing device, controller, or computer, which can include any existing programmable electronic control unit or dedicated electronic control unit or circuitry. Similarly, the processes, methods, algorithms, logic, or functional blocks can be implemented as stored data and instructions executable by a controller or computer in many forms including, but not limited to, information permanently stored on storage media such as ROM or RAM devices, for example. The processes, methods, algorithms, logic, or functional blocks can also be implemented in a software executable object and/or in whole or in part using suitable hardware components of an Application Specific Integrated Circuits (ASICs), Field-Programmable Gate Arrays (FPGAs), state machines, controllers or other hardware components or devices, or a combination of hardware, software, and firmware components.

Figure 1:
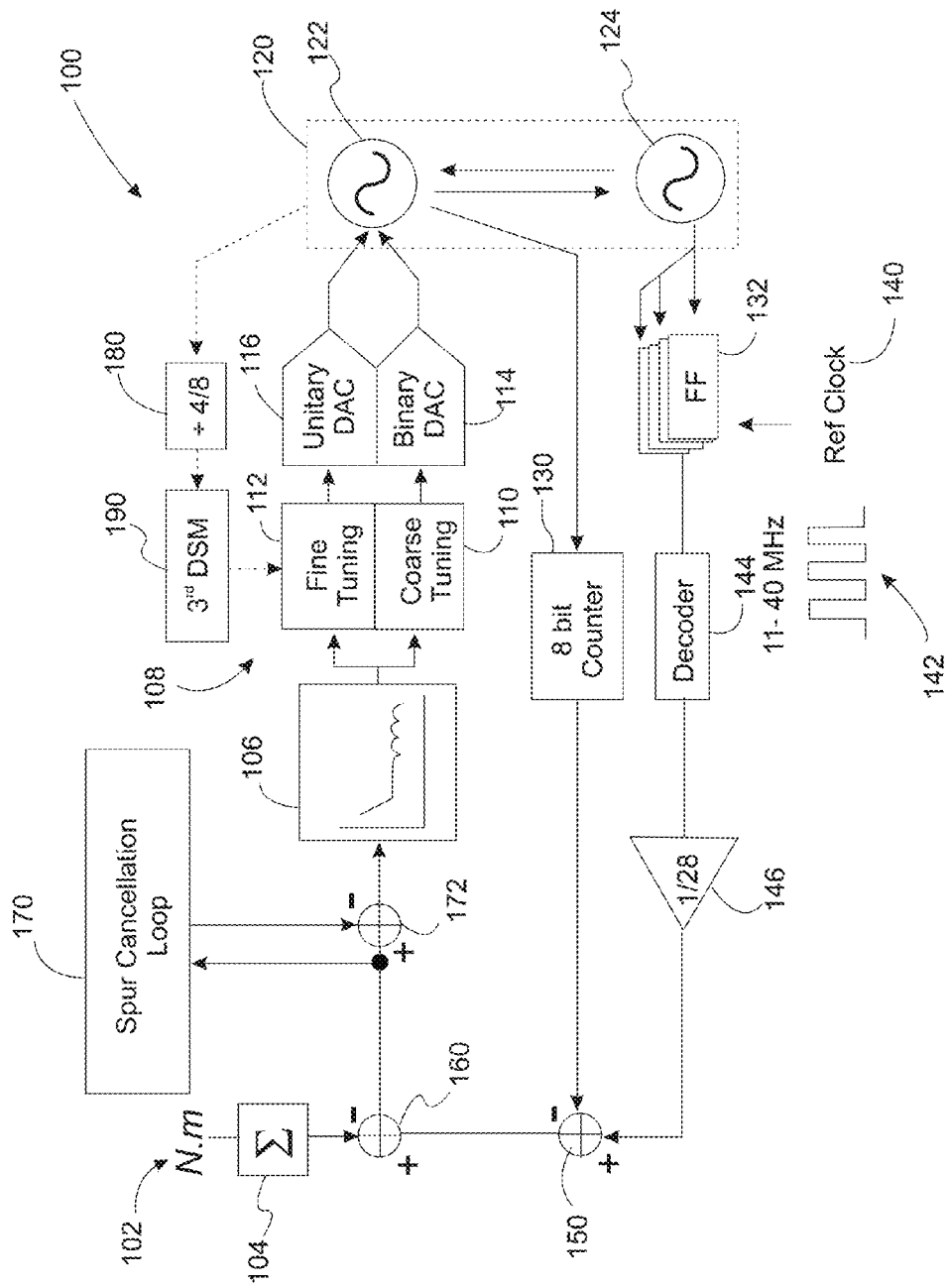
FIG. 1 is a block diagram illustrating a representative architecture for a digital phase locked loop (DPLL) of various representative embodiments of the disclosure.

FIG. 1 is a block diagram illustrating a representative architecture for a digital phase locked loop (DPLL) of various representative embodiments of the disclosure. The fractional-N DPLL is generally represented by reference numeral 100. The fractional-N operation is achieved by accumulating a frequency control word (N.m), represented at 102, by accumulator or summing block 104 rather than using a multi-modulus feedback divider to avoid the associated delta-sigma dithering noise. A digital loop filter 106 is fully reconfigurable to provide Type I, II, or III loop response for maximum flexibility to support multi-standard applications. A digitally controlled oscillator (DCO) 108 follows the digital loop filter 106 with coarse tuning 110 and fine tuning 112 provided by associated digital-to-analog converters (DACs) 114, 116, respectively, used in conjunction with an LC-tank oscillator 122 to digitally tune the output frequency. In this embodiment, the coarse DAC 114 is implemented by a binary-weighted metal insulator metal (MIM) capacitor array to compensate for the frequency variation due to process variation. The fine DAC 116 is implemented by a unitary weighted varactor array and is sigma-delta dithered at 190 by a divide-by-4 DCO frequency generated at 180 to achieve fine DAC resolution. LC-tank oscillator 122 is implemented by a top-biased P-N cross-coupled LC-tank oscillator for less power dissipation and better out-of-band phase noise.

In the representative embodiment of FIG. 1, an injection locked (IL) time-to-digital converter (TDC) 120 is provided to mitigate the cost overhead. As described in greater detail with respect to FIG. 2, the IL-TDC 120 does not require calibration and is utilized to perform fine phase quantization. The integer or coarse TDC is achieved by an 8-bit high-speed CMOS divider 130, which includes two stages. The first stage is a shift-register type CMOS ring divider used to divide DCO frequency of DCO 108 by a factor of 8, and designed to operate at a frequency greater than 5 GHz. The second stage is a carry-ripple counter, which is realized via digital synthesis design flow and operates up to 1 GHz. The fractional or fine TDC is achieved via a ring oscillator 124 that provides 28 phases to latches or flip-flops 132 clocked by reference clock 140. In this embodiment a reference clock signal 142 of between about 11 MHz and 40 MHz may be provided. The output of block 132 is provided oprovied to decoder 144 and combiner 146. The integer and fractional components are combined at 150. A difference between the combined output from 150 and the accumulated frequency control word is generated at 160.

Spur cancellation loop 170 is implemented by a gradient-based adaptive spur cancellation strategy to perform spur estimation and nullification as illustrated and described in greater detail with reference to FIG. 3. In the representative embodiment illustrated, the entire digital loop filter and cancellation algorithms of spur cancellation loop 170 are coded in register transfer language (RTL) and fully synthesized with automatic place-and-route layout via electronic design automation (EDA) tools. The total digital gate count including built-in logic for debugging purposes was about 82K, occupying an active area of 0.49 mm² on a prototype integrated circuit chip. Of course, gate count may be reduced by elimination of some or all of the debugging logic when the design is incorporated into various applications. The output of the spur cancellation loop 170 is subtracted at 172 to reduce or eliminate the spur prior to input to the digital loop filter 106.

Figure 2:
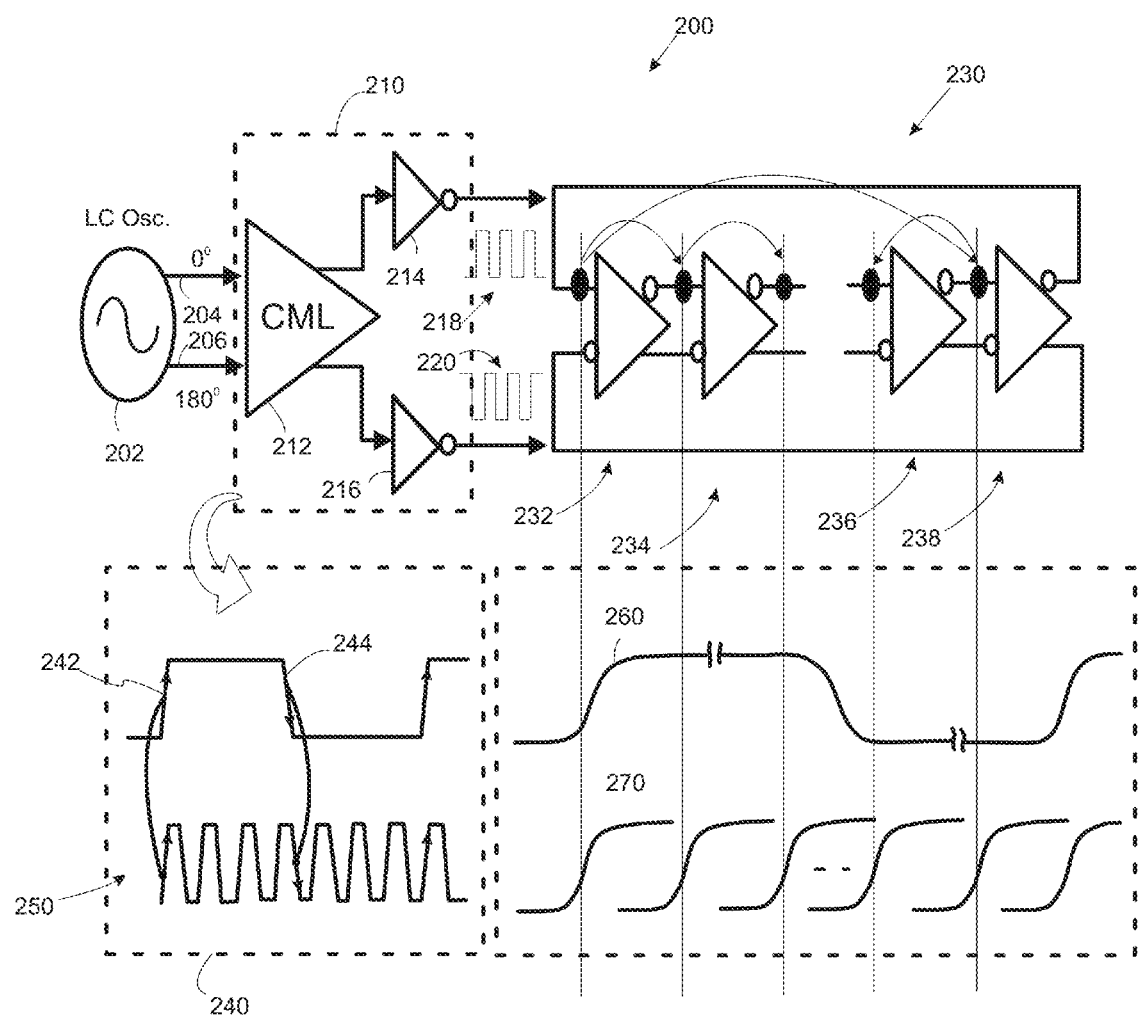
FIG. 2 is a block diagram illustrating a representative architecture and timing diagram for an injection locked time-to-digital converter (TDC) according to embodiments of the disclosure.

FIG. 2 is a block diagram illustrating a representative architecture and timing diagram for an injection locked (IL) time-to-digital converter (TDC) according to embodiments of the disclosure. IL-TDC 200 provides fine phase quantization using an injection locked ring oscillator (RO) 230 that is locked to LC-tank oscillator 202 of the DCO through IL buffer 210 so that minimal hardware is required. IL buffer 210 receives phase-shifted signals 204, 206 from LC oscillator 202 and includes current mode logic (CML) buffers 212 and CMOS buffers 214 to generate corresponding phase-shifted square wave signals 218, 220, respectively. Due to manufacturing process variation and wide frequency tuning ranges, the amplitude and common mode voltage of the DCO output varies. Therefore, the first stage CML buffer 212 is designed to reject the input common-mode noise and perform proper DC level shifting and signal amplification for the following stage. The second stage CMOS buffer represented at 214, 216 further amplifies the sinusoidal waveform into the square wave for stronger coupling strength to align the phase of the ring oscillator 230 with the DCO phase as generally represented in the timing diagrams.

In the embodiment illustrated in FIG. 2, the ring oscillator 230 includes multiple stages or phases, only four of which are illustrated and generally represented by stages 232, 234, 236, and 238. Under the injection-locked steady state operation, the frequency of ring oscillator 230 matches the frequency of the DCO (108, FIG. 1) such that the quantization steps of TDC 200 track with the DCO period over variations associated with process, voltage, and temperature (PVT) so that calibration is not required. Due to the multi-phase nature of the ring oscillator 230, it effectively divides one DCO period into M sub-sections, where M is twice the number of RO stages due to differential implementation as shown in the timing diagrams. Further phase refinement is provided by interpolation, which may include active or passive interpolation strategies. In the representative embodiment illustrated, passive interpolation is provided by resistor networks (not shown) between each RO stage 232, 234, 236, 238. The number of RO stages may be selected based on the desired number of sub-phases to meet desired performance parameters. In the representative embodiment illustrated, RO 230 includes seven (7) stages (four of which are shown) to achieve a total of 28 sub-phases within each DCO period.

As also illustrated by the timing diagrams of FIG. 2, the injection locking to the LC-tank oscillator 202 of the DCO periodically aligns the phase of RO 230 to that of the LC-tank DCO 202 and suppresses the accumulated jitter through delay elements. The bandwidth of injection locking is designed higher than the PLL bandwidth such that the RO 230 will not contribute additional in-band phase noise. Timing diagram 240 illustrates the phase refreshment in the output signal 250 of the ring oscillator 230 based on the rising edge 242 and falling edge 244 of the signal from LC-tank DCO 202 after the CML buffer 212. Signals 260 and 270 illustrate phase interpolation of the LC oscillator 202 through the various stages of the ring oscillator 230 to provide the desired fine phase quantization (28 sub-phases in this example) to meet design parameters.

Figure 3:
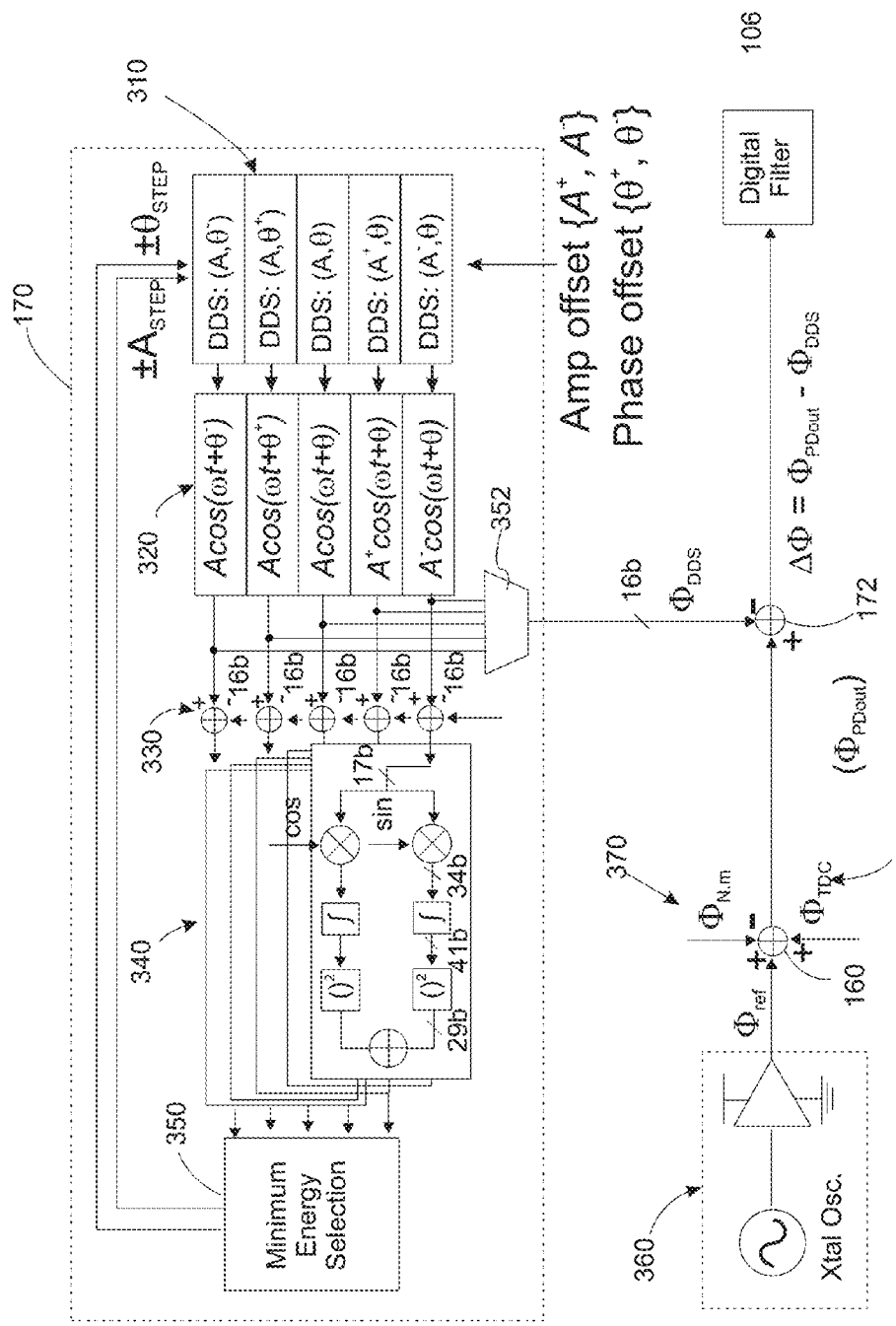
FIG. 3 is a block diagram illustrating a representative single spurious tone (spur) cancellation loop for a DPLL according to embodiments of the disclosure.

FIG. 3 is a block diagram illustrating a representative spurious tone (spur) cancellation loop for a DPLL according to embodiments of the disclosure. The present inventors have recognized that the occurrence of spurious tone causes phase perturbations between the input reference clock and the output of the DPLL. Since the coupled spurious tones associated with internal and external sources can vary in magnitude and phase, effective interference cancellation may require real-time monitoring of those spurs. The phase perturbation can be easily accessible in the digital domain for a DPLL for use in real-time monitoring and cancellation of spurs. In the representative embodiment illustrated, node PDout is used for this purpose and is located between summing blocks 160 and 172 as shown in FIGS. 1 and 3. The phase $\Phi_{PDout}$ represents the combined phase from an external noise aggressor 360 as well as internal sources associated with fractional-N operation $\Phi_{N,m}$ represented at 370 and quantization provided by TDC operation $\Phi_{TDC}$ as represented at 380.

The spur cancellation loop 170 uses phase information from PDout to estimate the properties of the spurious tone using a 2-D gradient descent algorithm, and then compensates it prior to the digital loop filter by subtracting the output of the spur cancellation loop at 172. In one embodiment, five skewed replicas of the spurious tone are generated from the digital direct synthesizer (DDS) blocks 310, 320 with either amplitude or phase offsets. The phase detector output (node PDout) is then subtracted from the five DDS outputs at 330. The subtracted values are then correlated with the I/Q sinusoids at the anticipated spur frequency and the squared values summed at 340 to select the minimum energy values at 350. The resulting values represent the residue energy after cancellation with the corresponding DDS output at 352. If the averaging duration in the I/Q correlator 340 is an integer multiple of the interference frequency, the estimation of residue energy will be more accurate and yield better cancellation. In many applications, the spur frequency can be known a-priori or estimated via spectral analysis, such as FFT, which is implemented off-chip.

The adaptive spur cancellation loop 170 operates iteratively. It begins with some initial estimation of the spur amplitude and phase. In the following iterations, the minimum residue energy will be selected at 350 and the corresponding DDS output (φDDS in FIG. 3) will be selected and subtracted from the signal path in the digital loop filter 106. The amplitude and phase offset values of the five DDS blocks 310, 320 will be updated toward the direction of minimum energy, i.e. the key principle of a gradient descent algorithm. The step size of the amplitude update $A_{STEP}$ and phase update $\theta_{STEP}$ determines the tradeoffs between cancellation accuracy and convergence speed. With proper settings, the convergence speed can be optimized below 2000 cycles. Although the algorithm of the representative embodiment illustrated mainly tracks the amplitude and phase property of the spurious tone, a slight frequency drift of the spurious tone can still be compensated as long as the resulting phase shift in between the TDC samples is within the phase step, $\theta_{STEP}$. Moreover, even when there is no spur presence, enabling the cancellation loop 170 will not cause any spur in the spectrum because the estimated amplitude of the spur will eventually be reduced to the noise level to minimize residue energy via the adaptive algorithm. This has been confirmed by lab measurements.

A prototype of the representative embodiment DPLL architecture illustrated in FIGS. 1-3 has been implemented on an integrated circuit chip using a 65 nm CMOS process. The DPLL occupied an active area of 0.75 mm². The overall power consumption was 22.95 mA excluding the PLL output buffers with the analog blocks consuming 15.8 mA, and the digital core dissipating 1.83 mA without the spur cancellation loop activated and 7.15 mA with the spur cancellation loop activated from a 1.0-V power supply.

Figure 4A:
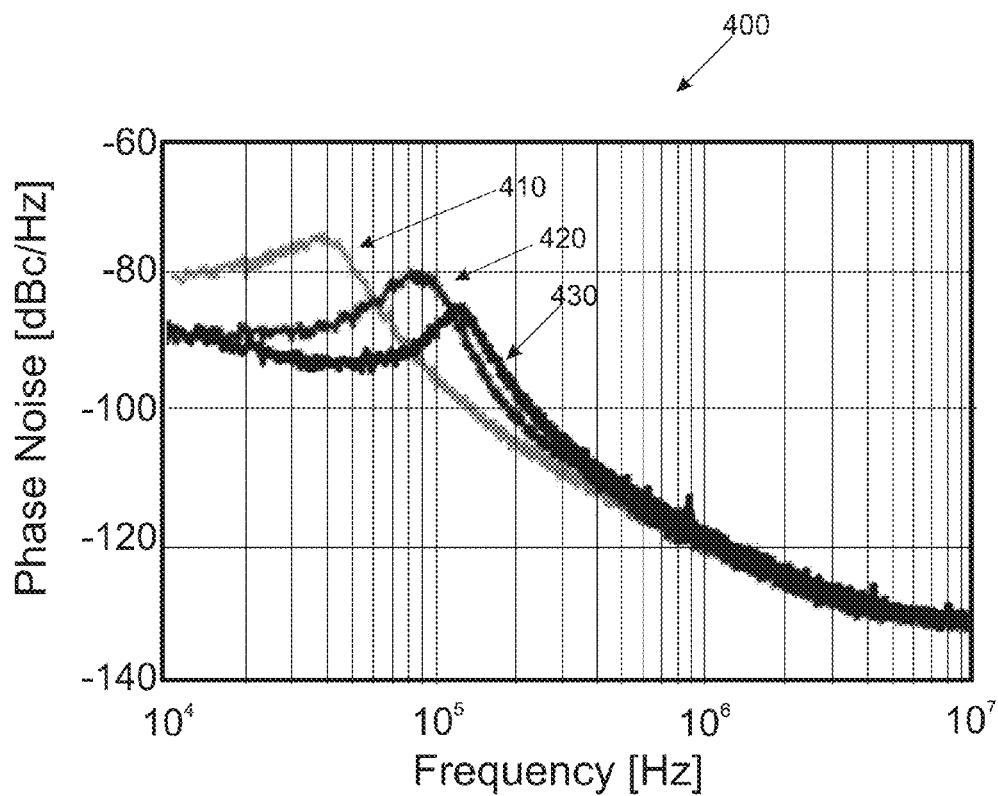
FIG. 4A illustrates a phase noise profile of a DPLL architecture according to representative embodiments operating in integer-N mode with different bandwidth settings.
Figure 4B:
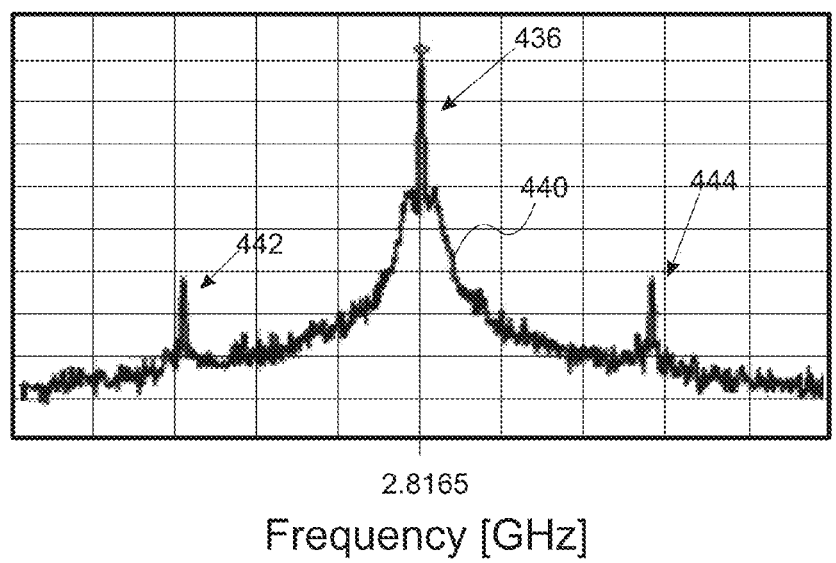
FIG. 4B illustrates power spectral density (PSD) of a representative embodiment of a DPLL according to the disclosure operating in fractional-N mode.

FIG. 4A illustrates a phase noise profile of a DPLL architecture according to representative embodiments operating in integer-N mode with different bandwidth settings, and FIG. 4B illustrates power spectral density (PSD) of a representative embodiment of a DPLL according to the disclosure operating in fractional-N mode, both based on a prototype chip implementation as previously described. The chip was tested with a 32 MHz reference clock. The phase noise plot of FIG. 4A illustrates operation in integer-N mode at 2.816 GHz with different loop bandwidth settings. Data 410 represent operation with narrow loop bandwidth settings. Data 420 represent operation with mediate loop bandwidth settings and data 430 represent operation with wide loop bandwidth settings. FIG. 4B illustrates a representative case of fractional-N operation at 2.8165 GHz represented by data 440 and peak 436 measured with fractional spurs 442, 444 of −52 dBc at 500 kHz offset.

FIG. 5 illustrates differential nonlinearity (DNL) associated with a representative embodiment of an injection-locked (IL) TDC according to the disclosure. As shown in FIG. 5, the measured DNL of the IL-TDC after injection-locking has a worst-case mismatch of 0.55 LSB without any missing code.

FIGS. 6A and 6B illustrate a measured reference spur used in evaluating performance of the prototype chip implementing a representative embodiment of a DPLL architecture according to the disclosure. Data 610 illustrate the DPLL operating frequency of 2.816 GHz represented by peak 620 with reference spurs 630, 632 at 32 MHz offset. The selected DPLL architecture and careful noise isolation between analog and digital blocks resulted in a measured reference spur 632 of −86.45 dBc. In this measurement, the DPLL bandwidth was set to 110 KHz and the setting time was about 18 μs.

Figure 7A:
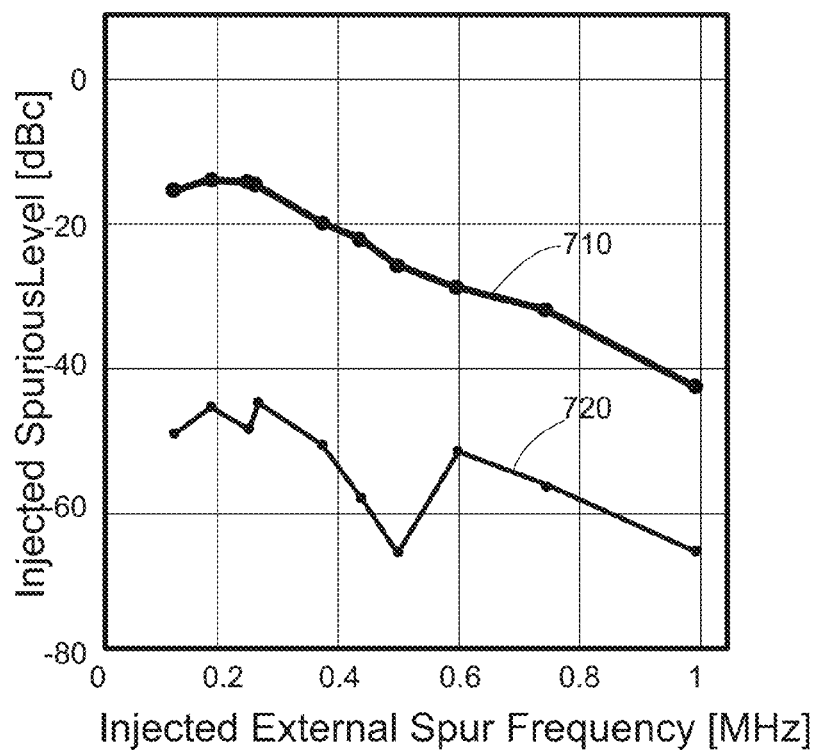
FIGS. 7A and 7B illustrate performance of representative embodiments of a spur cancellation loop in a DPLL architecture according to the disclosure based on an injected spur level.
Figure 7B:
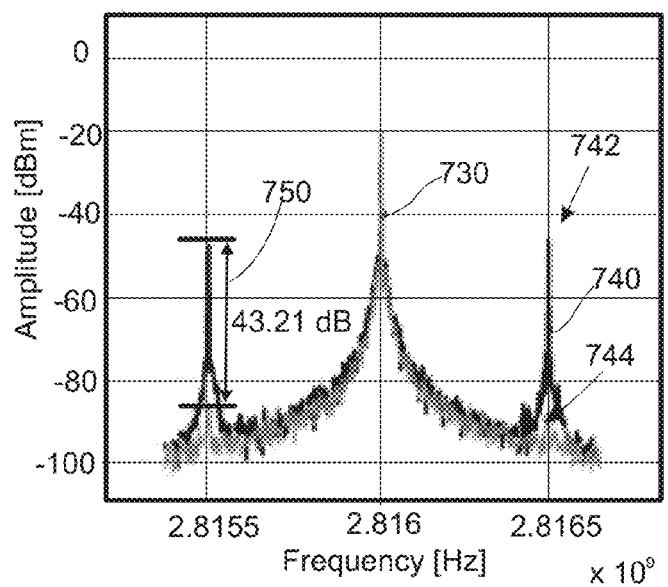

FIGS. 7A and 7B illustrate performance of representative embodiments of a spur cancellation loop in a DPLL architecture according to the disclosure based on an injected spur level. The data illustrated in FIGS. 7A and 7B resulted from injection of a single-tone sinusoidal interference ranging from 125 KHz to 1 MHz offset from the carrier frequency externally to the input clock buffer supply. Data 710 represent spur levels before activation of the spur cancellation loop and data 720 represent spur levels after activation of the spur cancellation loop. The spur magnitude before and after enabling the spur cancellation loop demonstrated 20-43 dB improvement over the measured frequencies. As shown in FIG. 7B, the spectrum snapshot includes data 730 representing operation with the spur cancellation loop activated and data 740 representing operating without the spur cancellation loop activated. The spur 740 is reduced as indicated at 744 highlighting a peak improvement of 43 dB as represented at 750 for the case of a 500 KHz offset spurious tone. The spurious tone cancellation measurements only included up to 1 MHz offset because the DPLL loop filter generally attenuates high frequency spurs. However, there is no fundamental frequency limit for spur cancellation according to the previously described embodiments as the DDS blocks can generate any tone within the Nyquist frequency. Moreover, it has been measured that the spur generated by internal fractional-N operation can be reduced by 15 dB via the cancellation algorithm. However, the internal fractional-N spur cancellation is limited by the finite word length effect of the DDS blocks.

As illustrated and described with reference to FIGS. 1-7, representative embodiments provide a fractional-N DPLL that synthesizes frequencies from 2.7 GHz to 4.8 GHz. The calibration-free injection locked TDC operates with an LC-tank DCO and is robust over PVT variations. Furthermore, a 2-D gradient descent spur cancellation strategy is provided to mitigate both external and internal spurious tones. Although the representative embodiments described above focus on cancellation of a single-tone spur, the adaptive spur cancellation algorithm can be extended for multi-tone cancellation and spur frequency tracking capability, i.e. a 3-D gradient descent algorithm.

FIGS. 8A and 8B illustrate a representative DPLL architecture having an IL-TDC and feedforward multi-tone spur cancellation according to embodiments of the disclosure. To achieve ultra-low spur levels, this embodiment includes a feedforward multi-tone spur cancellation loop in a fractional-N digital PLL architecture. The representative embodiment illustrated cancels fractional spurs caused by finite time-to-digital (TDC) quantization steps and associated differential non-linearity (DNL) when operated in fractional-N mode. In addition, the feedforward spur cancellation cancels external spurious tones that are in a harmonic relationship, as well as independent series of spurious tones that are not in a mutually harmonic relationship by cascading cancellation loops. A prototype 3-5 GHz digital PLL chip has been implemented using 65 nm CMOS technology and achieves a worst-case reference spur of −110.1 dB and a worst-case in-band fractional spur of −73.66 dB; both of which are lower than the reported spur level among state of the art PLLs. The internal or external spur magnitude reduction after enabling the cancellation loop ranges from 15 dB to 50 dB over different operation scenarios, which validates the effectiveness of the spur cancellation strategy described in detail with respect to FIGS. 9-16.

A representative system block diagram is shown in FIGS. 8A and 8B. The DPLL architecture 800 includes a feedforward spur cancellation loop 810 inserted before a digital loop filter (DLF) 812, which is implemented by a type-II DLF in this example. Operation of spur cancellation loop 810 suppresses the periodic phase disturbance before reaching the digitally controlled oscillator (DCO) 814. The output of DLF 812 controls a delta-sigma modulator 816, which digitally toggles a bank of the fine-resolution varactors 818 inside the LC-tank oscillator of DCO 814. The course or integer-N adjustment is provided by an array of MIM capacitors 820 as previously described with respect to the representative embodiment illustrated in FIG. 1. A calibration-free TDC 830 is composed of a 7-stage ring oscillator 832 that is injection-locked to the DCO 814 as previously described with reference to the embodiment illustrated in FIG. 2. Each stage of the ring oscillator 832 may be implemented as generally illustrated in FIG. 8B to provide differential operation between phases 834 and 836 with interpolation provided by active or passive coupling. In the representative embodiment illustrated, a passive resistor network is used to couple phases 834 and 836 so that each stage of ring oscillator 832 provides four (4) sub-phases of the DCO period to latches 838. As such, TDC 830 provides 28 levels or sub-phases of fine phase quantization within each period of DCO 814.

The output of the ring oscillator 832 is also provided to CMOS divider 840, which provides divide-by-four (/4) and divide-by-eight (/8) outputs to combiner or MUX 852 for input to delta-sigma modulator 816. The output of CMOS divider 840 is provided to decoder 842 and 5-bit counter 844 with the outputs combined at 846 and provided to latches 850. Synchronization of the integer code from latches 850 and fractional code from latches 838 is performed at 860 using the reference clock signal from reference clock 880. The fractional code is then processed by block 862 before being combined with the integer code at 864. The frequency control word (FCW) 870 is accumulated/integrated at 868 with the accumulated FCW subtracted from the TCDC output at 866 to provide fractional-N operation. The phase detector output ($PD_{OUT}$) is provided to feedforward multi-tone spur cancellation block 810, with the output of spur cancellation block 810 subtracted from the phase detector output at block 882 before passing to DLF 812.

Because the spur cancellation loop 810 is clocked at reference clock frequency provided by reference clock 880, spur cancellation loop 810 cannot mitigate the reference spur. Therefore, analog design techniques such as use of clock buffers having a high power supply rejection ratio (PSRR), differential clock routing, and careful analog/digital domain isolations minimize the reference spur level of DPLL 800.

The present inventors have recognized that both internal and external spurs generate a periodic phase disturbance at the output of the phase detector, i.e. TDC. This periodic phase disturbance creates a series of harmonic spurious tones that are integer multiples of $1/D_{period}$, where $D_{period}$ is the period of this repetitive pattern. The spur cancellation loop 810 observes periodic phase disturbances and identifies the shape of that pattern. By properly aligning the phase of the shape, the cancellation loop 810 subtracts it from the signal path. As a result, the periodic pattern is removed, and the spurious tones in the harmonic relationship are suppressed.

Figure 9:
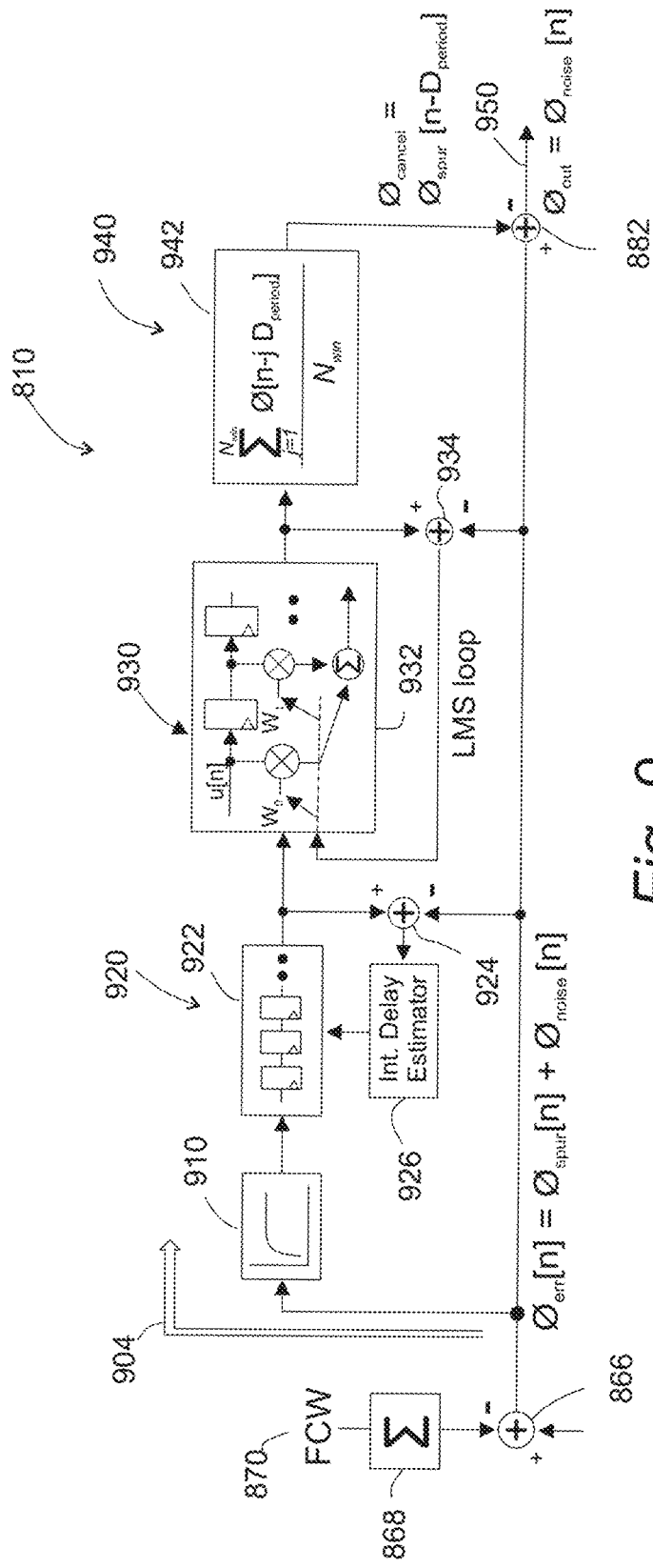
FIG. 9 is a block diagram illustrating a feedforward multi-tone spur cancellation loop according to representative embodiments of the disclosure.
Figure 10:
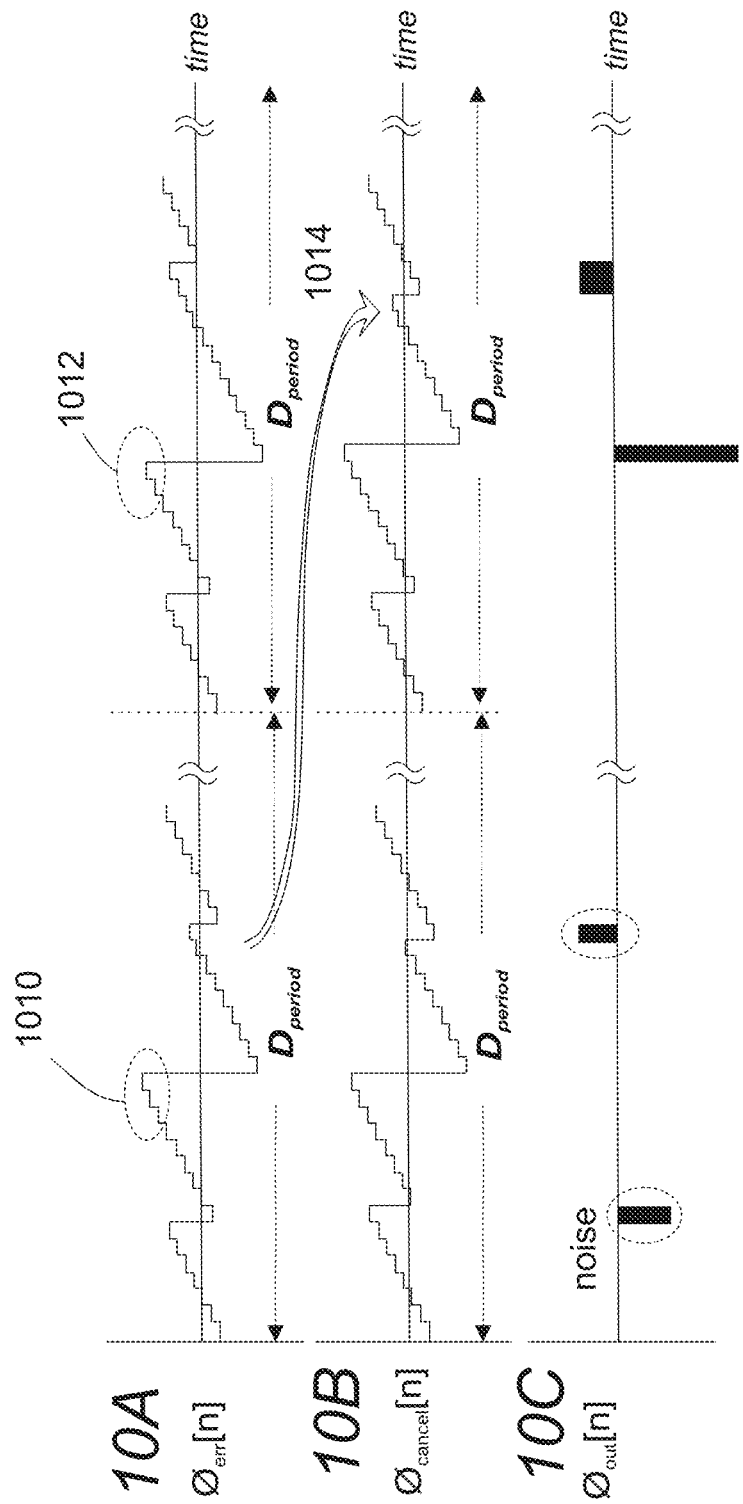
FIGS. 10A-10C illustrate operation of a feedforward multi-tone spur cancellation loop according to representative embodiments of the disclosure.

FIG. 9 is a block diagram illustrating a feedforward multi-tone spur cancellation loop according to representative embodiments of the disclosure. In the representative embodiment illustrated in FIG. 9, spur cancellation loop 810 includes a filter block 910, an integer delay block 920, a fractional delay block 930, and an averaging block 940. Filter block 920 includes a high pass filter with a zero inserted at DC to attenuate DC and the low-frequency content in the feedforward path 904 so that the overall PLL loop gain at DC and low frequencies will not be degraded after spur cancellation. The integer delay block 920 includes a chain of delay elements 922 that provides integer delay ($D_{int}$) in the feedforward path 904. The output of delay elements 922 is compared to the signal at 924 with the difference provided as feedback to an integer delay estimator 926, which adjusts the delay provided by block 922. Block 930 includes an adaptive fractional delay filter 932 that provides fractional delay ($D_{frac}$). The sum of $D_{int}$ and $D_{frac}$ should match the spur period, $D_{period}$. In most cases, the spur period is known a-priori. For example, fractional spurs are determined by the fractional part of frequency control word (FCW) 870 and the period can be calculated accordingly. Likewise, the external spur is typically coupled with other known clock domains in the SoC platform. In the case that the period is not known a priori, the delay can also be estimated via an adaptive loop that minimizes the error (e) energy between the signal path and the feedforward path as determined at 934. In this embodiment, the adaptive loop that minimizes the error is implemented by an LMS loop 936.

Once $D_{period}$ is determined, it can be used to properly set the delay of the cancellation loop 810. Because the input ($\Phi err$) of the feedforward cancellation loop 904 contains both spurious ($\Phi spur$) and random ($\Phi noise$) components, the loop should only extract spurious portions of the phase disturbance to avoid affecting the PLL noise transfer function. As such, the loop performs signal averaging in block 942 with a spacing of spur period such that the spurious signal is added constructively (i.e. processing gain is provided to learn the shape of the periodic pattern). The number of averaging cycles determines the quality of the learned shape, and may be programmable depending on the particular application. Lab measurements confirm that insufficient averaging leads to elevation of the phase noise floor.

FIGS. 10A-10C illustrate operation of a feedforward multi-tone spur cancellation loop according to representative embodiments of the disclosure. FIG. 10A illustrates a representative phase error signal $\Phi err$ with period $D_{period}$ such that it repeats at 1010 and 1012. FIG. 10B illustrates a corresponding representative cancellation signal $\Phi cancel$ generated by the feedforward spur cancellation loop that is time-shifted as indicated at 1014 by $D_{period}$ and combined with the signal at 882 as previously described with reference to FIGS. 8A, 8B, and 9. FIG. 10C illustrates the resulting output phase signal $\Phi out$ with the spurs removed such that only the noise remains.

A feedforward adaptive spur cancellation loop according to various embodiments of the disclosure may also be used to mitigate external spurs, including spurs having frequencies that are not an integer multiple of the reference clock frequency by incorporating a fractional averaging strategy. FIGS. 11-14 illustrate a representative embodiment of a fractional averaging strategy for a multi-tone spur cancellation loop to mitigate external spurs having frequencies that are not integer multiples of the reference clock frequency.

Figure 11:
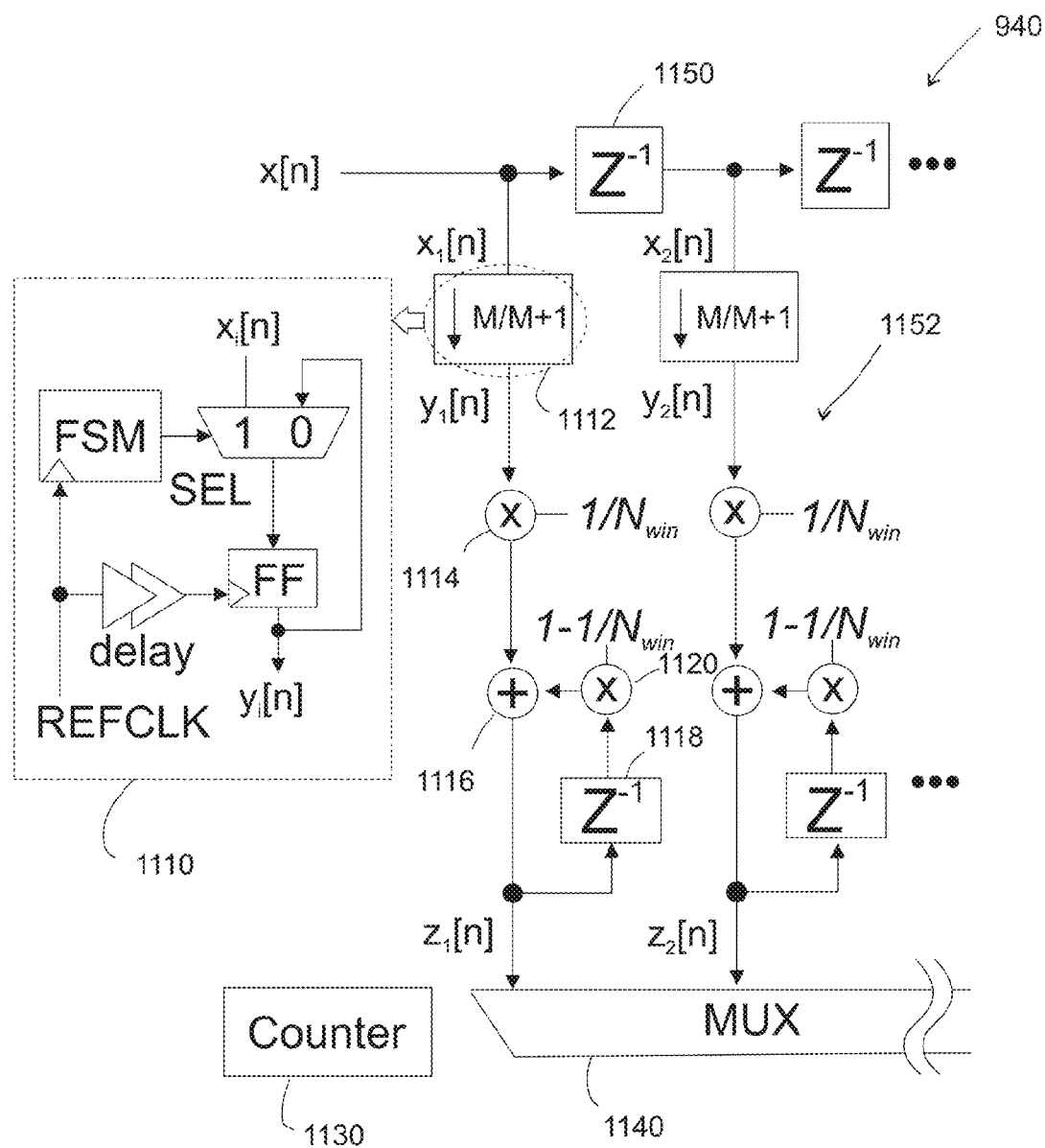
FIG. 11 illustrates operation of a fractional averaging strategy of a multi-tone spur cancellation loop according to representative embodiments of the disclosure.
Figure 12:
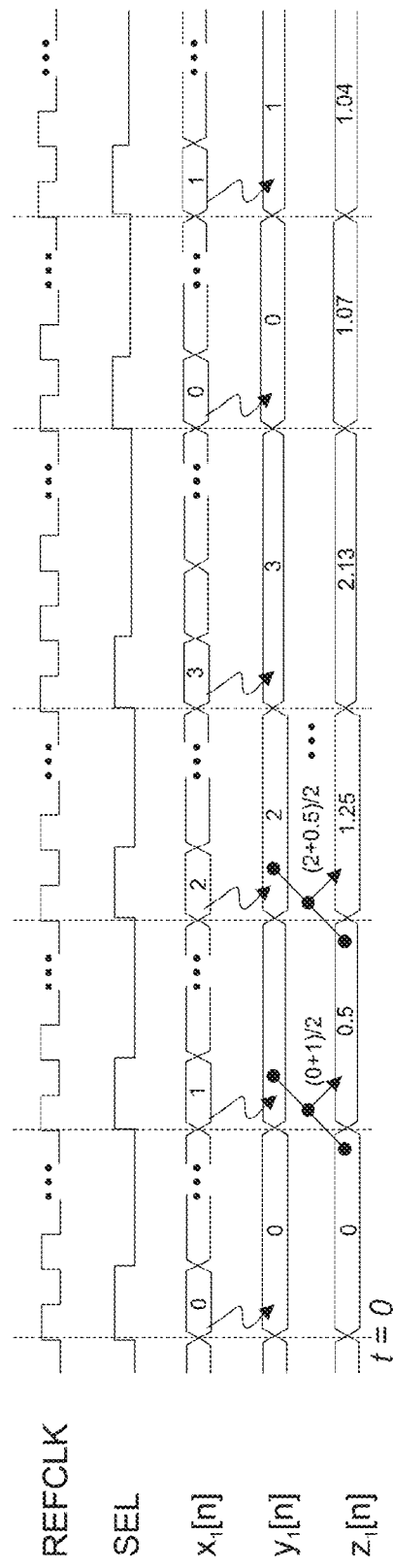
FIG. 12 is a signal timing diagram for the representative fractional averaging strategy illustrated in FIG. 11.

As shown in the block diagram of FIG. 11 and the associated signal timing diagram of FIG. 12 with $N_{win}=2$, downsampling at 1112 may be implemented as shown in block 1110 using a reference clock signal (REFCLK) and select signal (SEL) to downsample the input signal $x_1[n]$ resulting in signal $y_1[n]$. As described in greater detail with reference to FIG. 14, the downsampling may be operated in a fractional mode to better match the external spur frequency and cancel accumulated phase error. Signal $y_1[n]$ is multiplied at 1114 by the averaging window or period $1/N_{win}$ and then combined at 1116 after time shifting at 1118 and multiplying by $(1-1/N_{win})$ at 1120 to produce the signal $z_1[n]$. Signal $x[n]$ is time shifted by delay block 1150 with the time-shifted signal $x_2[n]$ processed in a similar manner. The resulting signals are combined by MUX 1140 based on clocking provided by counter 1130.

Figure 13:
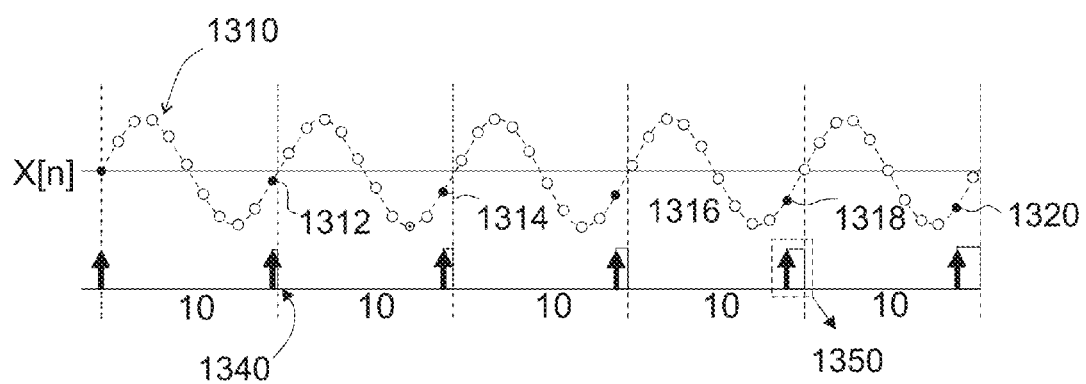
FIGS. 13 and 14 illustrate operation of integer and fractional averaging, respectively, within a multi-tone spur cancellation loop according to representative embodiments of the disclosure.
Figure 14:
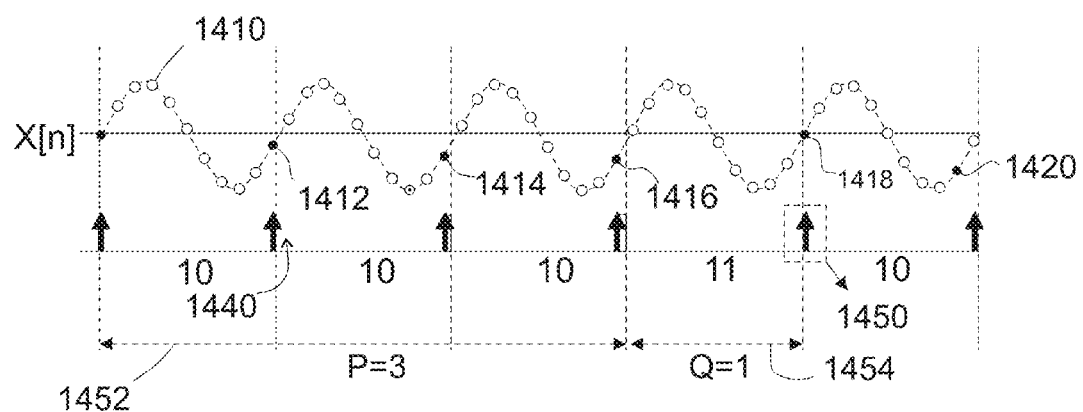

FIGS. 13 and 14 illustrate operation of integer and fractional averaging, respectively, within a multi-tone spur cancellation loop according to representative embodiments of the disclosure. In this representative example, the clock frequency is 20 MHz with a representative external spur that is not an integer multiple of the clock frequency of 1.9512 MHz, for example. As such, the adaptive feedforward spur cancellation loop uses a downsampling ratio of 10.25 to match the averaged waveform to the original spur waveform. However, if the input waveform is downsampled at the nearest integer (i.e. 10), the averaged waveform will be distorted because phase error will be accumulated as generally illustrated in FIG. 13. Signal $x[n]$ represented at 1310 is downsampled by a ratio of 10. As illustrated by points 1312, 1314, 1316, 1318, and 1320, the phase error continues to accumulate due to the mismatch between the spur frequency and the downsampling ratio with the accumulated phase error after four periods represented at 1350. To solve this issue, the downsampler 1112 is toggled between two integer ratios, M and M+1 for P and Q number of cycles, respectively, as illustrated in FIG. 14. The averaged downsampling ratio will be interpolated between M and M+1 according to:

$$[P \cdot M + Q \cdot (M+1)]/[P+Q] = [3 \cdot 10 + 1 \cdot 11]/[4] = 10.25$$

As illustrated by signal $x[n]$ represented by values 1410, the resulting phase error accumulates over the first three periods 1452 at 1412, 1414, and 1416, but is then significantly reduced or eliminated during the fourth period 1454 at 1418 such that the resulting phase error represented at 1450 is effectively cancelled. The phase error would then begin to increase again as represented at 1420 and the process repeats.

Figure 15:
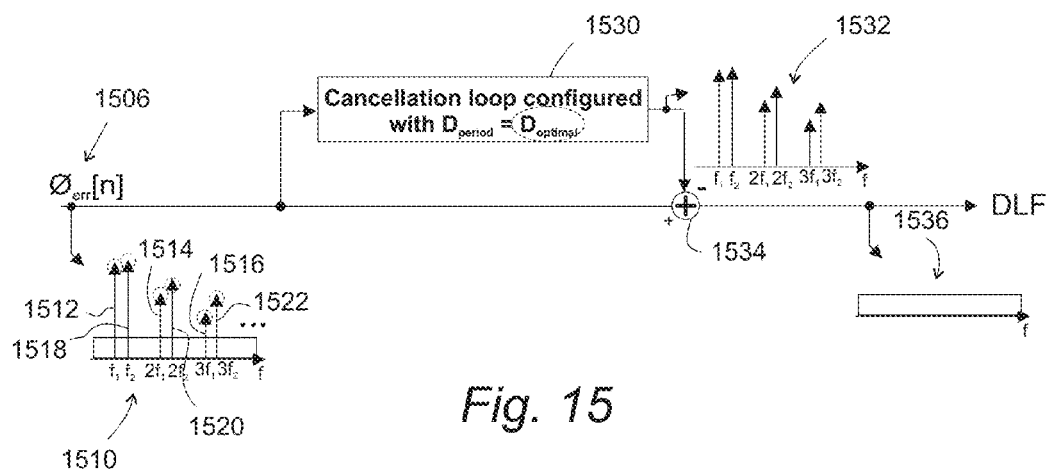
FIG. 15 illustrates operation of a single stage feedforward spur cancellation loop according to representative embodiments of the disclosure.

If the external spurs are coupled from two different sources with frequencies that are not in a harmonic relationship relative to one another or the reference clock, the feedforward spur cancellation loop may include a delay configuration equal to the least common factor of the two spur periods ($D_{period1}$ and $D_{period2}$). FIG. 15 illustrates a spur cancellation loop 1530 configured with $D_{period}=D_{optimal}$ where $D_{optimal}$ is based on the least common factor of the two spur periods. Input signal $\Phi err[n]$ at 1506 includes a frequency spectrum represented at 1510 including a first spur frequency ($f_1$) represented at 1512 and associated harmonics represented at 1514 and 1516 in addition to a second spur frequency ($f_2$) represented at 1518 and associated harmonics represented at 1520 and 1522. As such, the delay chain period may be represented by:

$$D_{period1}=f_{ref}/f_1$$

$$D_{period2}=f_{ref}/f_2$$

$$D_{optimal}=lcm(D_{period1},D_{period2})$$

such that $D_{optimal} >> D_{period1}$ and $D_{optimal} >> D_{period2}$

Spur cancellation loop 1530 includes a single stage delay based on $D_{optimal}$ to produce a corresponding output represented at 1532, which is subtracted from the input signal 1506 at 1534 to reduce or cancel the first and second external spurs as generally represented at 1536. The resulting signal is then input to the digital loop filter (DLF). While this approach may be suitable for some applications, it may result in a long delay chain that may adversely impact the phase noise floor making it unsuitable for many applications.

Figure 16:
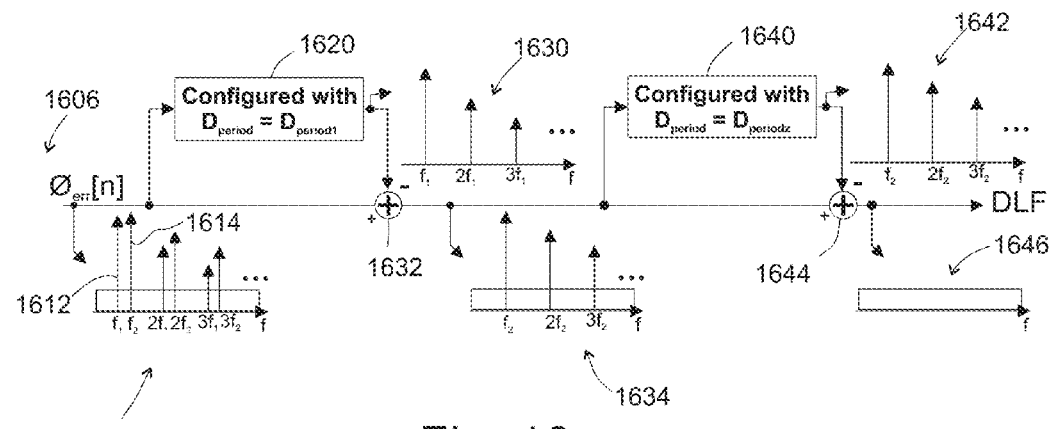
FIG. 16 illustrates operation of a multi-stage feedforward spur cancellation loop according to representative embodiments of the disclosure.

As shown in FIG. 16, the cancellation loop can be cascaded with each stage delay individually tuned based on a particular spur frequency represented by $D_{period1}$ and $D_{period2}$ in the representative embodiment illustrated. The cancellation operation is orthogonal in between stages and is scalable to more stages, if necessary, to cancel additional spurs. Input signal $\Phi err[n]$ represented at 1606 includes spurs 1610 having frequency $f_1$ and harmonics as represented at 1612 and frequency $f_2$ and harmonics as represented at 1614. The spur cancellation loop includes a first stage 1620 configured with $D_{period}=D_{period1}$ based on $f_1$ to generate a cancellation signal as represented at 1630. The cancellation signal is subtracted from the input signal at 1632 to cancel the first spur with the resulting signal represented at 1634 containing only the second spur at frequency $f_2$. A second stage 1640 of the spur cancellation loop is configured with $D_{period}=D_{period2}$ based on the second spur frequency $f_2$. The resulting cancellation signal is represented at 1642 and subtracted from the input signal at 1644 to cancel the second spur as generally represented at 1646.

A prototype integrated circuit chip implementing a DPLL architecture as described in the representative embodiment of FIGS. 8-16 was manufactured with an active area of 0.77 mm$^2$ in 65 nm CMOS, and consumed 20.9 mW from a 1V power supply with performance characteristics measured as illustrated in FIGS. 17 and 18. FIG. 17A illustrates the measured worst-case fractional spur across different FCW settings. Data 1710 represents measurements without activation of the feedforward adaptive spur cancellation loop. Data 1720 represents measurements after activation of the feedforward adaptive spur cancellation loop. As shown in FIG. 17A, the worst-case fractional spur ranges from −73.66 dBc to −117 dBc, indicating at least 20 dB to 50 dB improvement after enabling the cancellation loop.

Figure 17B:
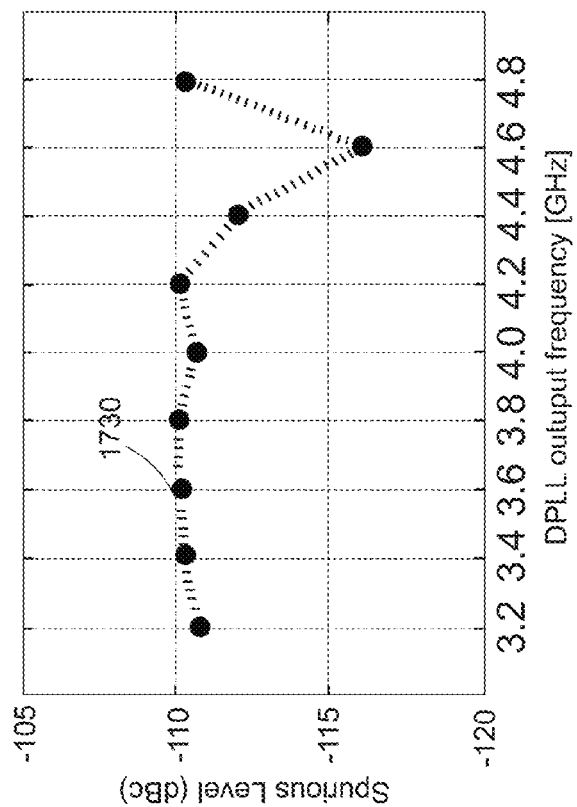
FIGS. 17A-17D illustrate performance of a representative embodiment of a DPLL having a single-stage feedforward spur cancellation loop and IL TDC.
Figure 17A:
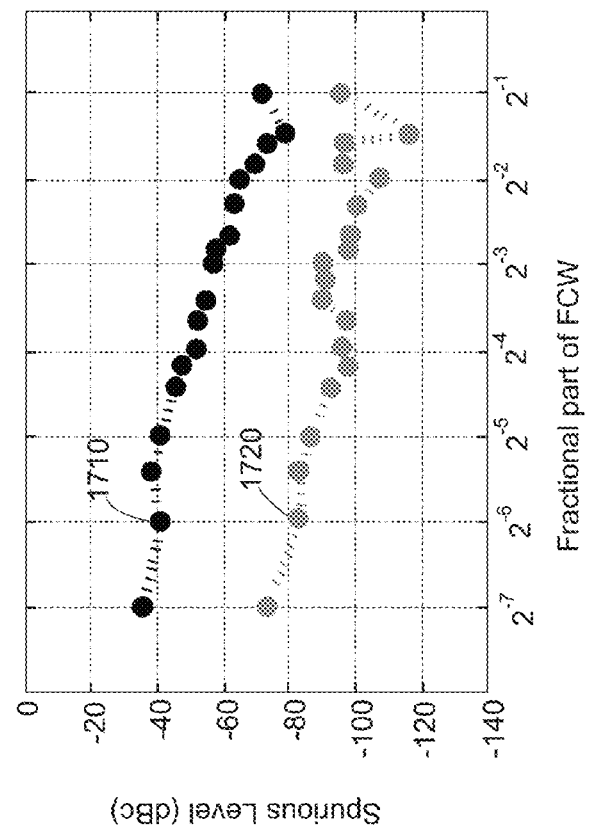
Figure 17C:
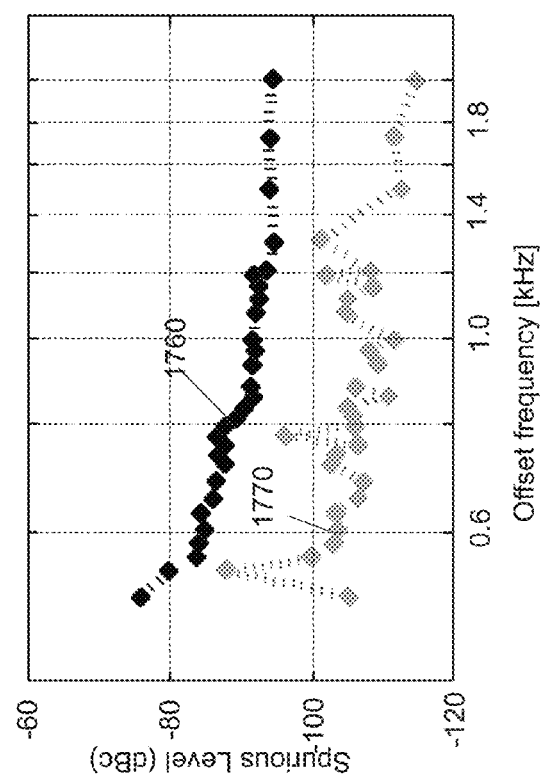
Figure 17D:
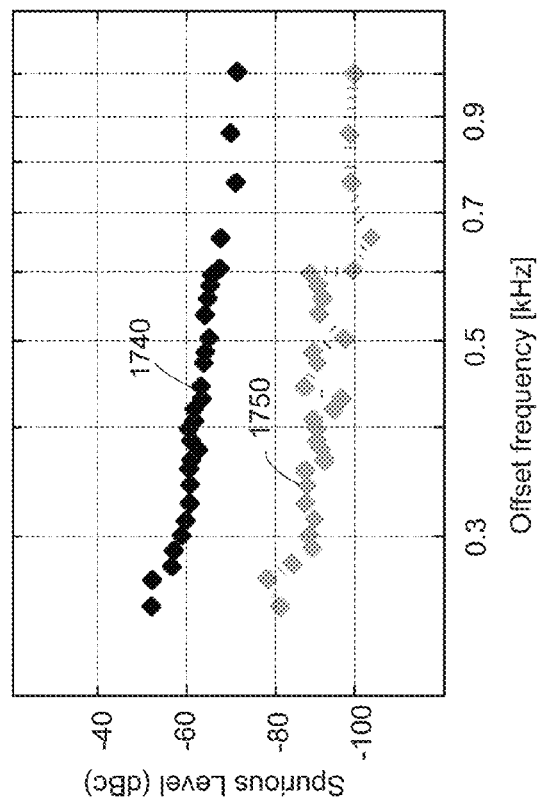

FIG. 17B illustrates the reference spur measured across the entire DPLL operation range as represented by data 1730. The plot shows the spur level ranges from −110.1 dBc to −116.1 dBc, which results from the deployed analog techniques as previously described. FIG. 17C illustrates the measured reduction in spur level for the fundamental of an injected spurious tone using a single-stage cancellation strategy in the feedforward spur cancellation loop. Data 1740 represent the spur levels as a function of offset frequency with spur cancellation disabled. Data 1750 represent the reduction in spur levels as a function of offset frequency with the spur cancellation loop active. FIG. 17D illustrates the measured reduction in spur level for the $2^{nd}$ harmonic of the injected spurious tone as a function of offset frequency. Data 1760 represent the spur levels before cancellation while data 1770 represent the spur levels after cancellation by the adaptive feedforward spur cancellation loop employing a single-stage cancellation strategy.

Figure 18A:
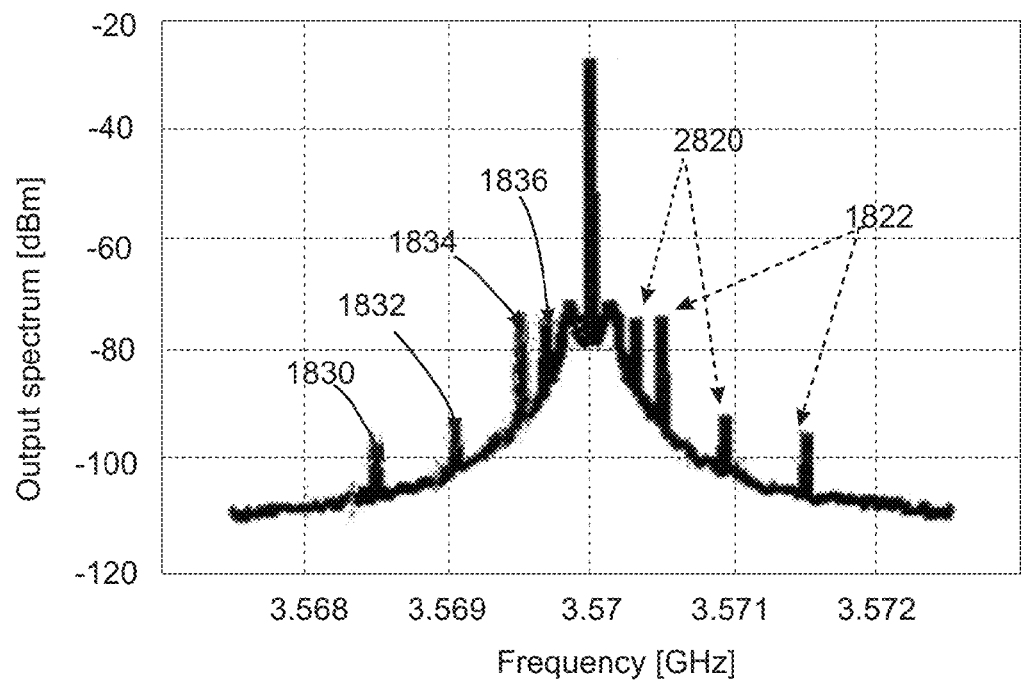
FIGS. 18A-18B illustrate performance of a representative embodiment of a DPLL having a two-stage feedforward spur cancellation loop and IL TDC.
Figure 18B:
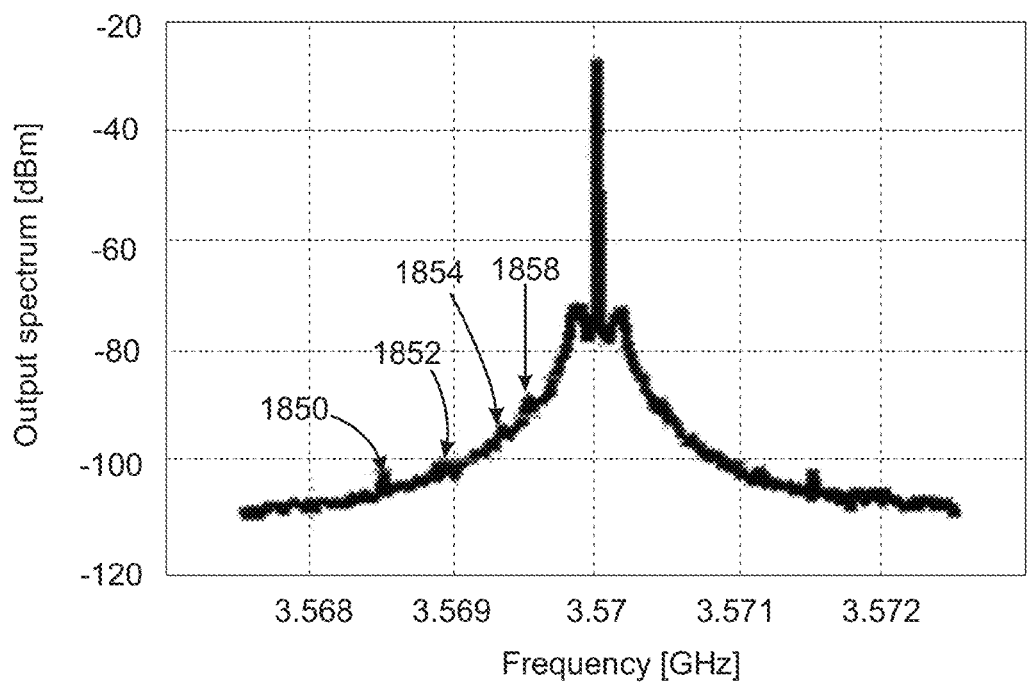

FIGS. 18A-18B illustrate performance of a representative embodiment of a DPLL having a two-stage feedforward spur cancellation loop and IL-TDC. FIG. 18A illustrates the DPLL output without spur cancellation. FIG. 18B illustrates the DPLL output after spur cancellation using a cascaded two-stage cancellation loop. To demonstrate the multi-tone cancellation clearly, a saw tooth disturbance was injected intentionally via the input buffer supply. Two independent series of triangular disturbing waveforms were injected with fundamental tones at 312 kHz offset as represented at 1820 and 495 kHz offset as represented at 1822 from the carrier frequency resulting in spurs 1830, 1832, 1834, and 1836. After enabling the cascaded two-stage spur cancellation loop, both series of spurs are cancelled or reduced to levels beneath the noise floor as illustrated in FIG. 18B at 1850, 1852, 1854, and 1856. The measured in-band phase noise achieves −103 dBc at 100 kHz frequency offset and out-of-band phase noise of −122 dBc at 3 MHz frequency offset with integrated phase noise of −38.1 dBc (RMS jitter of 557 fs) from 10 kHz to 40 MHz.

As demonstrated by the representative embodiments illustrated and described above, a robust and low-cost fractional-N DPLL includes adaptive spur cancellation and a calibration-free IL-TDC. By leveraging the injection locked ring oscillator, the TDC may achieve a fine resolution of 7 ps that automatically tracks the period of the DCO such that no TDC gain calibration is required over PVT. Single-stage and multi-stage spur cancellation strategies are provided to suppress spurious tones due to external or internal interferences.

While representative embodiments are described above, it is not intended that these embodiments describe all possible forms of the claimed subject matter. The words used in the specification are words of description rather than limitation, and it is understood that various changes may be made without departing from the spirit and scope of the disclosure and claimed subject matter. Additionally, the features of various embodiments may be combined to form further embodiments not explicitly described or illustrated, but within the scope of the disclosure and claimed subject matter and recognizable to one of ordinary skill in the art. While various embodiments may have been described as providing advantages or being preferred over other embodiments or prior art implementations with respect to one or more desired characteristics, one or more features or characteristics may be compromised to achieve desired overall system attributes, which depend on the specific application and implementation. These attributes include, but are not limited to: cost, strength, durability, life cycle cost, marketability, appearance, packaging, size, serviceability, weight, manufacturability, ease of assembly, etc. Embodiments described as less desirable than other embodiments or prior art implementations with respect to one or more characteristics are not necessarily outside the scope of the disclosure and may be desirable for particular applications.

What is claimed is:

1. A digital phase-locked loop comprising:
   a digital loop filter;
   a digitally controllable oscillator (DCO) connected to an output of the digital loop filter; and
   a time-to-digital converter (TDC) having an input buffer connected to the DCO, and a ring oscillator connected to the input buffer, the input buffer converting a sinusoidal signal from the DCO to a differential square wave signal provided to the ring oscillator such that a ring oscillator frequency matches a DCO frequency.

2. The digital phase-locked loop of claim 1 further comprising:
   a spur cancellation loop disposed between a TDC output and an input of the digital loop filter, the spur cancellation loop generating a spur cancellation signal based on an estimate of a spurious tone amplitude and phase, the spur cancellation signal subtracted from TDC output signals prior to the TDC output signals being input to the digital loop filter.

3. The digital phase-locked loop of claim 2, the estimate based on a gradient descent algorithm.

4. The digital phase-locked loop of claim 1, the DCO comprising an LC-tank oscillator wherein the buffer is connected to the LC-tank oscillator.

5. The digital phase-locked loop of claim 1, the buffer comprising:
   a first stage configured to reject input common-mode noise and amplify and shift a DC level of the sinusoidal signal; and
   a second stage configured to amplify signals from the first stage and convert the sinusoidal signal to the differential square wave signal.

6. The digital phase-locked loop of claim 5, the first stage comprising current mode logic (CML) and the second stage comprising CMOS logic.

7. A digital phase-locked loop comprising:
   a digital loop filter;
   a digitally controllable oscillator (DCO) connected to an output of the digital loop filter;
   a time-to-digital converter (TDC) having an input buffer connected to the DCO, and a ring oscillator connected to the input buffer, the input buffer converting a sinusoidal signal from the DCO to a differential square wave signal provided to the ring oscillator such that a ring oscillator frequency matches a DCO frequency; and
   a spur cancellation loop disposed between a TDC output and an input of the digital loop filter, the spur cancellation loop generating a spur cancellation signal based on an estimate of a spurious tone amplitude and phase, the spur cancellation signal subtracted from TDC output signals prior to the TDC output signals being input to the digital loop filter, the spur cancellation loop comprising:
   a plurality of digital synthesizers each generating a skewed replica signal of the spurious tone with one of an amplitude offset and a phase offset;
   a plurality of correlators each generating a correlation signal based on a correlation between sine and cosine signals having an estimated spurious tone frequency and a difference between a respective skewed replica signal and an output of the TDC; and
   a minimum energy selector configured to select a minimum residue energy signal from the plurality of correlation signals.

8. A digital phase-locked loop comprising:
   a digital loop filter;
   a digitally controllable oscillator (DCO) connected to an output of the digital loop filter; and
   a time-to-digital converter (TDC) having an input buffer connected to the DCO, and a ring oscillator connected to the input buffer, the input buffer converting a sinusoidal signal from the DCO to a differential square wave signal provided to the ring oscillator such that a ring oscillator frequency matches a DCO frequency; and
a spur cancellation loop disposed between a TDC output and an input of the digital loop filter, the spur cancellation loop generating a spur cancellation signal based on an estimate of a spurious tone amplitude and phase, the spur cancellation signal subtracted from TDC output signals prior to the TDC output signals being input to the digital loop filter, wherein the spur cancellation loop includes a feedforward path comprising:
a high-pass filter;
an integer delay chain including a plurality of delay elements connected in series with an input connected to an output of the high-pass filter and configured to provide an integer delay;
an adaptive fractional delay filter connected to an output of the integer delay chain and configured to provide a fractional delay, the sum of the integer delay and the fractional delay corresponding to a spur period; and
signal averaging logic configured to receive an output of the adaptive fractional delay filter and compute an averaged spur cancellation signal based on the spur period.

9. The digital phase-locked loop of claim 8, the signal averaging logic comprising fractional averaging logic configured to compute an averaged spur cancellation signal based on downsampling of the output of the adaptive fractional delay filter by a first integer factor for a first number of spur periods and by a second integer factor for a second number of spur periods to provide fractional downsampling.

10. The digital phase-locked loop of claim 8 further comprising a second spur cancellation loop cascaded with the spur cancellation loop between the output of the TDC and the input of the digital loop filter, the second spur cancellation loop including a feedforward path comprising:
a second high-pass filter;
a second integer delay chain including a plurality of delay elements connected in series with an input connected to an output of the second high-pass filter and configured to provide an integer delay;
a second adaptive fractional delay filter connected to an output of the second integer delay chain and configured to provide a fractional delay, the sum of the integer delay and the fractional delay corresponding to a second spur period different from the spur period; and
second signal averaging logic configured to receive an output of the second adaptive fractional delay filter and to compute an averaged spur cancellation signal based on the second spur period.

11. The digital phase-locked loop of claim 8 further comprising an integer delay estimator configured having an input configured to receive a difference between an output of the integer delay chain and an input of the high pass filter, and an output connected to the integer delay chain.

12. The digital phase-locked loop of claim 8 further comprising a spur period estimator configured to estimate the spur period based on minimizing an error between an output of the adaptive fractional delay filter and the input of the high pass filter.

13. A digital phase-locked loop comprising:
a digital loop filter;
a digitally controllable oscillator (DCO) connected to an output of the digital loop filter; and
a time-to-digital converter (TDC) having an input buffer connected to the DCO, and a ring oscillator connected to the input buffer, the input buffer converting a sinusoidal signal from the DCO to a differential square wave signal provided to the ring oscillator such that a ring oscillator frequency matches a DCO frequency, wherein the ring oscillator comprising a plurality of stages connected in sequence with resistors connected between adjacent stages to provide interpolated phase signals.

14. A method for reducing a spurious tone during operation of a phase-locked loop, the method comprising:
generating a spur cancellation signal based on an estimated spur frequency in an output signal from a time-to-digital converter (TDC); and
subtracting the spur cancellation signal from the output signal prior to the output signal being supplied to a digital loop filter, wherein generating the spur cancellation signal comprises filtering the TDC output signal with a high pass filter having a zero at DC to generate a filtered signal, applying an integer delay to the filtered signal and a fractional delay to the integer delayed signal, and averaging the delayed signal based on an estimated period of the spurious tone.

15. The method of claim 14, wherein generating the spur cancellation signal comprises estimating the spur frequency based on a gradient descent algorithm.

16. The method of claim 14 further comprising:
coupling a multi-stage ring oscillator of the TDC to a digitally controlled oscillator to match frequency of the ring oscillator to frequency of the digitally controlled oscillator.

17. A system having a phase-locked loop comprising:
a spur cancellation loop between a time-to-digital converter (TDC) and a digital loop filter, the spur cancellation loop configured to generate a spur cancellation signal based on an estimate of a spurious tone amplitude and phase, the spur cancellation signal subtracted from TDC output signals prior to the TDC output signals being input to a digital loop filter, the spur cancellation loop having a feedforward path comprising:
a high-pass filter;
an integer delay chain including a plurality of delay elements connected in series with an input connected to an output of the high-pass filter and configured to provide an integer delay;
an adaptive fractional delay filter connected to an output of the integer delay chain and configured to provide a fractional delay, the sum of the integer delay and the fractional delay corresponding to a spur period; and
signal averaging logic configured to receive an output of the adaptive fractional delay filter and compute an averaged spur cancellation signal based on the spur period.

18. The system of claim 17 further comprising:
a digitally controlled oscillator having an LC-tank oscillator;
a buffer coupled to the LC-tank oscillator and configured to amplify and convert a sinusoidal signal from the LC-tank oscillator to a square wave signal;
a ring oscillator having a plurality of stages including an input stage coupled to the buffer.

19. The system of claim 17 wherein the signal averaging logic comprises fractional averaging logic that computes the averaged spur cancellation signal based on downsampling of the output of the adaptive fractional delay filter by a first integer factor for a first number of spur periods and by a second integer factor for a second number of spur periods to provide fractional downsampling.

\* \* \* \* \*